US009362140B2

(12) United States Patent
Hu (10) Patent No.: US 9,362,140 B2
(45) Date of Patent: Jun. 7, 2016

(54) PACKAGE STACK DEVICE AND FABRICATION METHOD THEREOF (75) Inventor: Dyi-Chung Hu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 91 days.

(21) Appl. No.: 13/530,563

(22) Filed: Jun. 22, 2012

(65) Prior Publication Data

US 2013/0175687 A1 Jul. 11, 2013

(30) Foreign Application Priority Data

Jan. 6, 2012 (TW) .............................. 101100716 A (51) Int. Cl.
*H01L 21/00* (2006.01)
*H01L 21/56* (2006.01)
*H01L 25/10* (2006.01)
*H01L 23/31* (2006.01)
*H01L 25/16* (2006.01)
*H01L 23/498* (2006.01)

(52) U.S. Cl.
CPC .............. *H01L 21/56* (2013.01); *H01L 25/105* (2013.01); *H01L 23/3128* (2013.01); *H01L 23/49816* (2013.01); *H01L 25/162* (2013.01); *H01L 2224/16225* (2013.01); *H01L 2224/32225* (2013.01); *H01L 2224/73204* (2013.01); *H01L 2225/1023* (2013.01); *H01L 2225/1058* (2013.01); *H01L 2924/3511* (2013.01)

(58) Field of Classification Search
CPC .................................................. H01L 23/3142
USPC ....................................................... 257/686
See application file for complete search history.

(56) References Cited

U.S. PATENT DOCUMENTS

| 7,569,935 | B1* | 8/2009 | Fan ................................. 257/737 |
| 2007/0235856 | A1 | 10/2007 | Haba et al. |
| 2008/0054437 | A1 | 3/2008 | Hwang |
| 2008/0073769 | A1* | 3/2008 | Wu et al. ........................ 257/686 |
| 2008/0142943 | A1 | 6/2008 | Kim et al. |
| 2009/0045524 | A1 | 2/2009 | Mohammed et al. |
| 2009/0146303 | A1* | 6/2009 | Kwon ............................ 257/741 |
| 2009/0174081 | A1* | 7/2009 | Furuta ........................... 257/777 |
| 2010/0140798 | A1* | 6/2010 | Topacio et al. ................ 257/737 |
| 2011/0140259 | A1* | 6/2011 | Cho et al. ....................... 257/686 |
| 2011/0149493 | A1* | 6/2011 | Kwon et al. .............. 361/679.02 |
| 2012/0018877 | A1* | 1/2012 | Yang et al. .................... 257/737 |
| 2012/0104607 | A1* | 5/2012 | Weng ............................. 257/738 |
| 2012/0193789 | A1* | 8/2012 | Hu et al. ........................ 257/738 |

FOREIGN PATENT DOCUMENTS

CN          101355070 A          1/2009

* cited by examiner

*Primary Examiner* — William Harriston
(74) *Attorney, Agent, or Firm* — Mintz Levin Cohn Ferris Glovsky and Popeo, P.C.; Peter F. Corless; Steven M. Jensen (57) ABSTRACT A package stack device includes a first package structure having a plurality of first metal posts and a first electronic element, a second package structure having a plurality of second metal posts and a second electronic element, and an encapsulant formed between the first and second package structures to encapsulate the first electronic element. By connecting the second metal posts to the first metal posts, respectively, the second package structure is stacked on the first package structure with the support of the metal posts. Further, the gap between the two package structures is filled with the encapsulant to avoid warpage of the substrates.

9 Claims, 7 Drawing Sheets

PACKAGE STACK DEVICE AND FABRICATION METHOD THEREOF

CROSS-REFERENCES TO RELATED APPLICATIONS

This application claims under 35 U.S.C. §119(a) the benefit of Taiwanese Application No. 101100716, filed Jan. 6, 2012, the entire contents of which is incorporated herein by reference.

BACKGROUND OF THE INVENTION

1. Field of the Invention

The present invention relates to package stack devices and fabrication methods thereof, and more particularly, to a package stack device and a fabrication method thereof for improving the stack yield.

2. Description of Related Art

Figure 1:
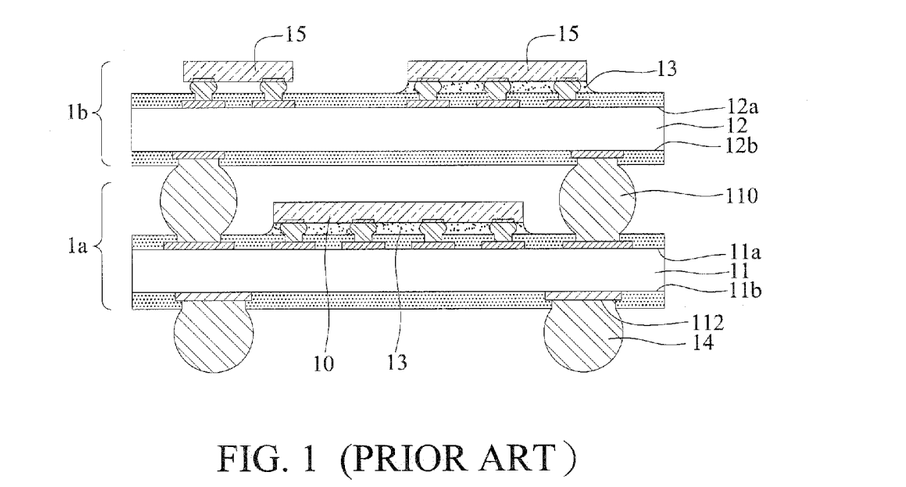
FIG. 1 is a cross-sectional view of a conventional package stack device.

Along with the development of semiconductor packaging technologies, various types of packages haven been developed for semiconductor devices. In order to further enhance electrical performance and save packaging spaces, a plurality of package structures are stacked on one another to form a POP (package on package) device. As such, electronic elements having different functions, such as memories, CPUs (central processing units), GPUs (graphics processing units), image application processors and the like, can be integrated together so as to be applied in various kinds of compact-sized and low-profiled electronic products. FIG. 1 schematically illustrates a cross-sectional view of a conventional package stack device.

Referring to FIG. 1, a second package structure 1b is stacked on a first package structure 1a.

The first package structure 1a has a first substrate 11 having a first surface 11a and a second surface 11b opposite to the first surface 11a, and a first electronic element 10 disposed on the first surface 11a and electrically connected to the first substrate 11. The second package structure 1b has a second substrate 12 having a third surface 12a and a fourth surface 12b opposite to the third surface 12a, and a second electronic element 15 disposed on the third surface 12a and electrically connected to the second substrate 12. Further, a plurality of solder balls 110 are formed on the first surface 11a of the first substrate 11 so as for the fourth surface 12b of the second substrate 12 to be stacked thereon and electrically connected to the first substrate 11. Furthermore, the second surface 11b of the first substrate 11 has a plurality of ball pads 112 for mounting solder balls 14. The first and second electronic elements 10, 15 can be active components and/or passive components. Referring to the drawing, the first and second electronic elements 10, 15 can be electrically connected to the substrates 11, 12, respectively, in a flip-chip manner and an underfill 13 can fill the gap therebetween so as to form flip-chip bonding structures.

However, since the second package structure 1b is stacked on the first package structure 1a by soldering, the surfaces of the first and second package structures 1a, 1b can be easily contaminated by the solder material of the solder balls 110 during the reflow process. Further, variation in the size of the solder balls 110 is not easy to control, which can easily result in a tilted stack between the two package structures and even cause positional deviation of joints between the two package structures.

Furthermore, to increase the stack height, the diameter of the solder balls 110 must be increased, thus increasing the area of the surfaces (the first surface 11a and the fourth surface 12b) occupied by the solder balls 110 and consequently reducing spaces available for layout of the electronic elements and circuits.

Moreover, increased size of the solder balls 110 can easily cause bridging between the solder balls, thus reducing the product yield.

In addition, the second package structure 1b is only supported by the solder balls 110 on the first package structure 1a such that a big gap exists between the first and second package structures 1a, 1b. Therefore, warpage can easily occur to the first and second substrates 11, 12.

Therefore, there is a need to provide a package stack device and a fabrication method thereof so as to overcome the above-described drawbacks.

SUMMARY OF THE INVENTION

Accordingly, the present invention provides a package stack device, which comprises: a first package structure, comprising: a first substrate having a first surface with a plurality of first metal posts formed thereon and a second surface opposite to the first surface; and a first electronic element disposed on the first surface of the first substrate and electrically connected to the first substrate; a second package structure, comprising: a second substrate having a third surface and a fourth surface opposite to the third surface, wherein the fourth surface has a plurality of second metal posts which are connected to the first metal posts, respectively, so as for the second package structure to be stacked on the first package structure, and the height of the second metal posts is greater than, equal to or less than that of the first metal posts; and a second electronic element disposed on the third surface of the second substrate and electrically connected to the second substrate; and an encapsulant formed between the first surface of the first substrate and the fourth surface of the second substrate to encapsulate the first electronic element.

The present invention further provides a fabrication method of a package stack device, which comprises the steps of: providing a first substrate having a first surface with a plurality of first metal posts formed thereon and a second surface opposite to the first surface, disposing a first electronic element on the first surface of the first substrate and electrically connecting the first electronic element and the first substrate so as to form a first package structure, providing a second substrate having a third surface and a fourth surface opposite to the third surface, and disposing a second electronic element on the third surface of the second substrate and electrically connecting the second electronic element and the second substrate so as to form a second package structure, wherein the fourth surface of the second substrate has a plurality of second metal posts and the height of the second metal posts is greater than, equal to or less than that of the first metal posts; connecting the second metal posts to the first metal posts, respectively, so as to stack the second package structure on the first package structure; and forming an encapsulant between the first surface of the first substrate and the fourth surface of the second substrate for encapsulating the first electronic element.

The present invention further provides a package stack device, which comprises: a first package structure, comprising: a first substrate having a first surface with a plurality of first metal posts formed thereon and a second surface opposite to the first surface; a first electronic element disposed on the first surface of the first substrate and electrically connected to the first substrate in a flip-chip manner; and an underfill formed between the first electronic element and the first surface of the first substrate; a second package structure, comprising: a second substrate having a third surface and a fourth surface opposite to the third surface, wherein the fourth surface has a plurality of second metal posts which are connected to the first metal posts, respectively, so as for the second package structure to be stacked on the first package structure, and the height of the second metal posts is greater than, equal to or less than that of the first metal posts; and a second electronic element disposed on the third surface of the second substrate and electrically connected to the second substrate; and an encapsulant formed between the first surface of the first substrate and the fourth surface of the second substrate to encapsulate the first electronic element and the underfill.

In the above-described device, the first substrate can have a plurality of metal bumps disposed thereon for mounting the first electronic element, and the metal bumps can be copper bumps. Further, a solder material can be formed on the metal bumps and encapsulated by the underfill.

In the above-described devices and method, the first and second metal posts can be copper posts and formed by electroplating, but it should be noted that the present invention is not limited thereto.

In the above-described devices and method, the end surfaces of the first metal posts can have a width greater than, equal to or less than the width of the end surfaces of the second metal posts.

In the above-described devices and method, a solder material can be formed on each of the first metal posts for bonding with the corresponding second metal post.

In the above-described devices and method, the second surface of the first substrate can have a plurality of ball pads for mounting solder balls.

In the above-described devices and method, the first electronic element can be an active component and/or a passive component, and there is no special limitation on it. Further, the first electronic element can be electrically connected to the first substrate through wire bonding or in a flip-chip manner.

Therefore, the present invention aligns and connects the first and second metal posts so as to facilitate the stacking process for stacking the second package structure on the first package structure. Further, since the metal posts are formed by electroplating, the metal material of the metal posts will not contaminate the surfaces of the substrates. Furthermore, variation in the size of the metal posts is easy to control, thereby overcoming the conventional drawbacks of tilted stack and joint deviation between the package structures.

Moreover, any variation in the height of the metal posts will not increase the diameter of the metal posts and hence the surface area of the substrates that is occupied by the metal posts will not increase, thereby avoiding reduction of available spaces for layout of the electronic elements and circuits.

Also, since the metal posts are formed by electroplating, the present invention avoids the risk of bridging when the height of the metal posts is increased, thereby increasing the product yield.

In addition, the present invention avoids warpage of the substrates since the package structures are supported by the metal posts and the gap between the package structures is filled with the encapsulant.

DETAILED DESCRIPTION OF PREFERRED EMBODIMENTS

The following illustrative embodiments are provided to illustrate the disclosure of the present invention, these and other advantages and effects can be apparent to those in the art after reading this specification.

FIGS. 2A to 2G are cross-sectional views showing a fabrication method of a package stack device according to the present invention.

Figure 2A:
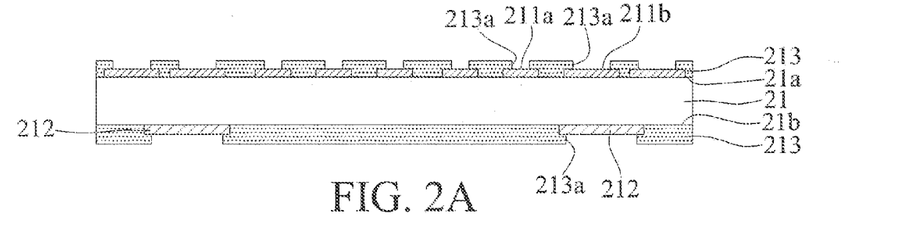
FIGS. 2A to 2G are cross-sectional views showing a fabrication method of a package stack device according to the present invention, wherein FIGS. 2G' and 2G" show other embodiments of FIG. 2G.

Referring to FIG. 2A, a first substrate 21 having a first surface 21a and a second surface 21b opposite to the first surface 21a is provided. The first surface 21a of the first substrate 21 has a plurality of bonding pads 211a and a plurality of contact pads 211b. The second surface 21b of the first substrate 21 has a plurality of ball pads 212.

In the present embodiment, an insulating protection layer 213 such as a solder mask layer is formed on the first and second surfaces 21a, 21b of the first substrate 21, and a plurality of openings 213a are formed in the insulating protection layer 213 for exposing the bonding pads 211a, the contact pads 211b and the ball pads 212, respectively.

Figure 2B:
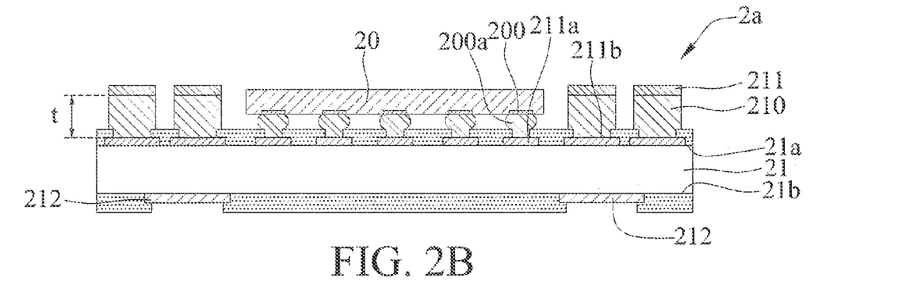

Referring to FIG. 2B, a plurality of first metal posts 210 are formed on the exposed surfaces of the contact pads 211b by electroplating, and a first electronic element 20 is mounted on the exposed surfaces of the bonding pads 211a through a plurality of solder bumps 200a, i.e., the electrode pads 200 of the first electronic element 20 are electrically connected to the first substrate 21 in a flip-chip manner, thereby forming a first package structure 2a.

In the present embodiment, the first metal posts 210 are copper posts, and a solder material 211 can be formed on the copper posts for facilitating a subsequent stacking process. The first electronic element 20 can be an active component such as a chip or a passive component such as a resistor, a capacitor or an inductor. In addition, a plurality of first electronic elements 20 can be provided, which can be active components, passive components or a combination thereof.

Figure 2C:
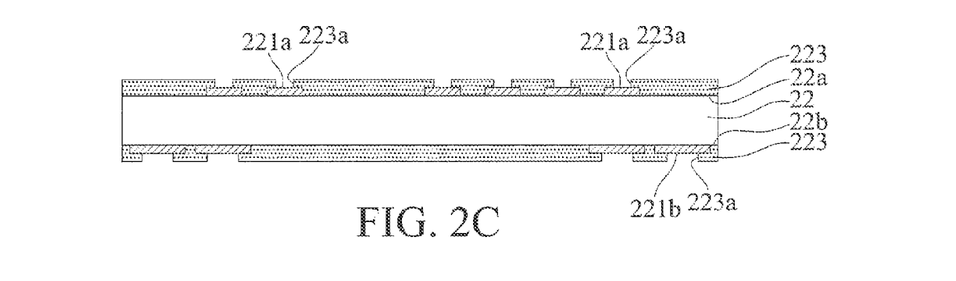

Referring to FIG. 2C, a second substrate 22 having a third surface 22a and a fourth surface 22b opposite to the third surface 22a is provided. The third surface 22a of the second substrate 22 has a plurality of bonding pads 221a, and the fourth surface 22b of the second substrate 22 has a plurality of contact pads 221b. Further, an insulating protection layer 223 such as a solder mask layer is formed on the third and fourth surfaces 22a, 22b of the second substrate 22, and a plurality of openings 223a are formed in the insulating protection layer 223 for exposing the bonding pads 221a and the contact pads 221b, respectively.

Figure 2D:
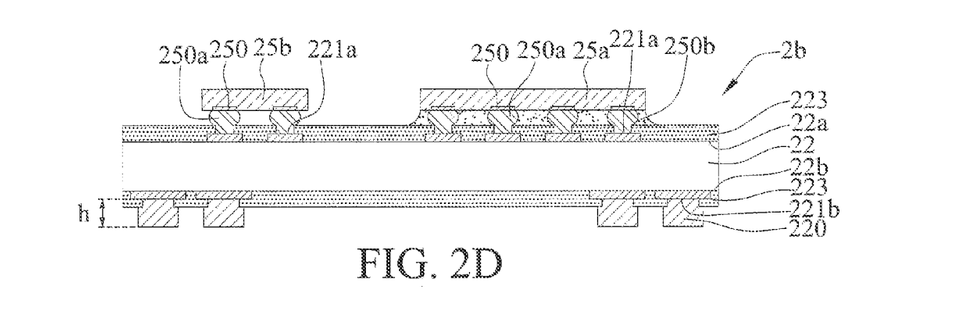

Referring to FIG. 2D, a plurality of second metal posts 220 such as copper posts are formed on the exposed surfaces of the contact pads 221b of the second substrate 22 by electroplating. The height h of the second metal posts 220 is less than the height t of the first metal posts 210 or less than the sum of the height of the first metal posts 210 and the height of the solder material 211. Further, a plurality of second electronic elements 25a, 25b are mounted on the exposed surfaces of the bonding pads 221a of the second substrate 22 through solder bumps 250a. As such, a second package structure is obtained. The electrode pads 250 of the second electronic elements 25a, 25b are electrically connected to the second substrate 22 in a flip-chip manner.

In the present embodiment, the second electronic element 25a is an active component such as a semiconductor chip such that an underfill 250b needs to be disposed between the second electronic element 25a and the third surface 22a of the second substrate 22. On the other hand, the second electronic element 25b is a passive component such as a resistor, a capacitor or an inductor, which does not need an underfill to be disposed between the second electronic element 25b and the third surface 22a of the second substrate 22.

Figure 2E:
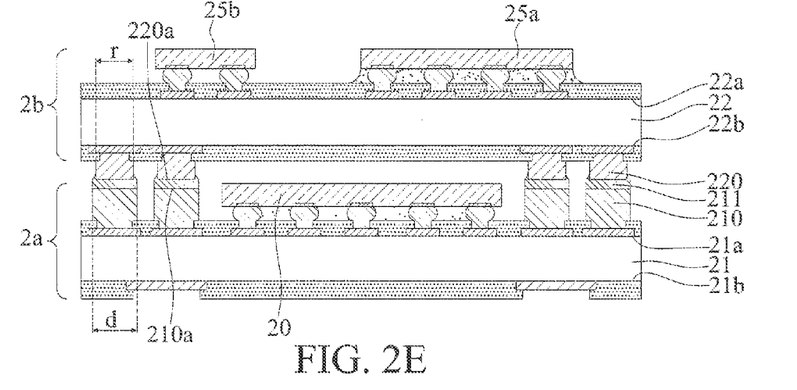

Referring to FIG. 2E, the second metal posts 220 are connected to the first metal posts 210 (or the solder material 211 on the first metal posts 210), respectively, to thereby stack the second package structure 2b on the first package structure 2a.

In the present embodiment, the width d (or maximum diameter) of the end surfaces 210a (surfaces bonding with the second metal posts 220) of the first metal posts 210 is greater than the width r of the end surfaces 220a of the second metal posts 220. Such a difference in width facilitates alignment of the first and second package structures so as to avoid the risk of joint deviation.

Further, increase in the heights of the first and second metal posts 210,220 will not lead to an increase in the diameters of the first and second metal posts 210,220. Therefore, a compact-sized and low-profiled device can be achieved. Furthermore, an increased number of the first and second metal posts 210, 220 can be provided in a predetermined region so as to facilitate the alignment of the first and second package structures 2a, 2b.

Figure 2F:
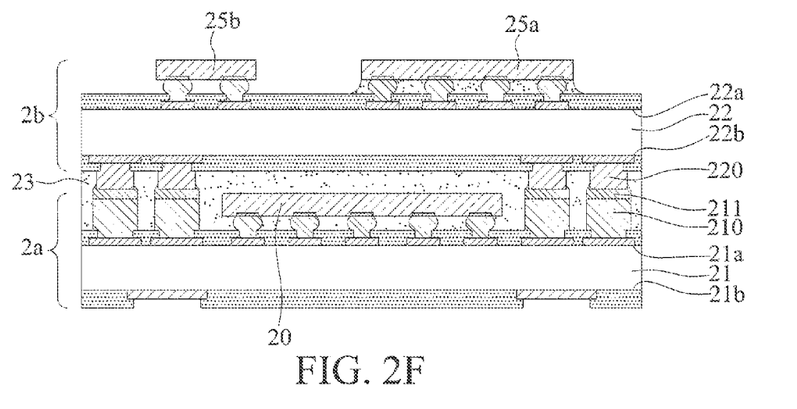

Referring to FIG. 2F, an encapsulant 23 is formed between the insulating protection layer 213 on the first surface 21a of the first substrate 21 and the insulating protection layer 223 on the fourth surface 22b of the second substrate 22 to encapsulate the first electronic element 20.

Figure 2G:
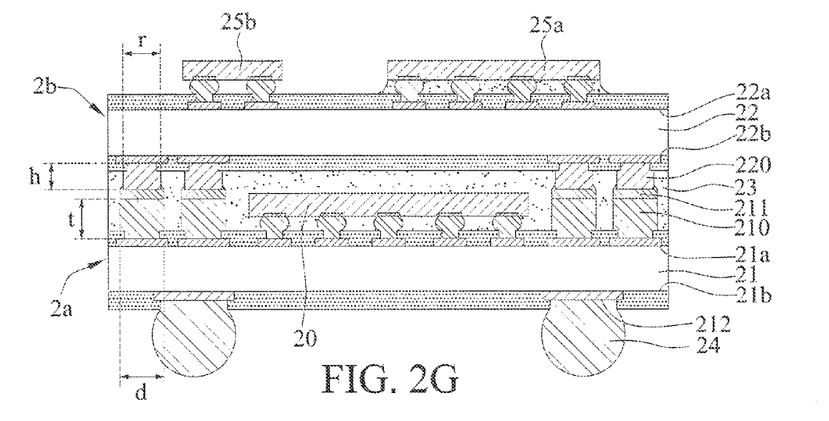

Referring to FIG. 2G, a plurality of solder balls 24 are mounted on the exposed surfaces of the ball pads 212 of the first substrate 21.

Referring to FIG. 2G', the width d' (such as diameter) of the end surfaces 210b of the first metal posts 210' can be equal to the width r' (such as diameter) of the end surfaces 220b of the second metal posts 220'. Although the end surfaces 210b, 220b of the metal posts 210',220' have the same width, since variation in the size of the metal posts are easy to control, the use of the metal posts facilitates vertical stacking of the package structures and helps to reduce the risk of joint deviation as compared with the prior art.

Alternatively, referring to FIG. 2G", the width d" of the end surfaces 210c of the first metal posts 210" can be less than the width r" of the end surfaces 220c of the second metal posts 220".

Figure 3:
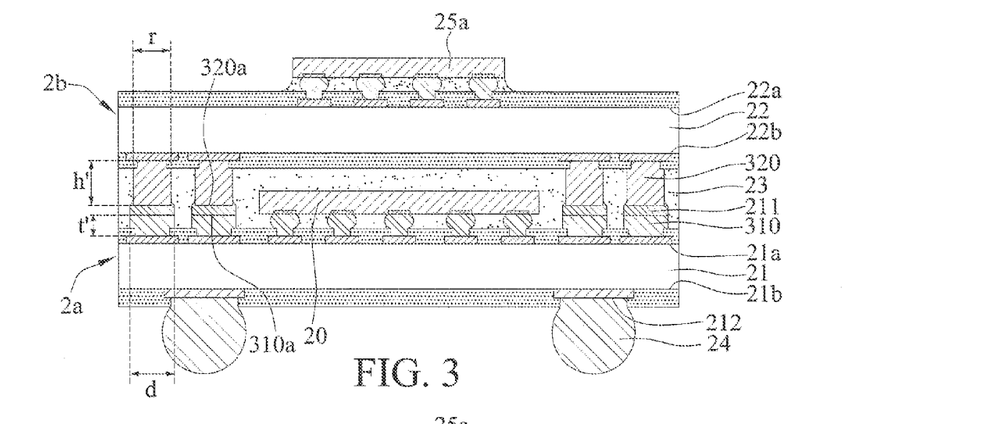
FIGS. 3 to 4 are cross-sectional views showing other embodiments of the package stack device of the present invention.

Referring to FIG. 3, in another embodiment, the height h' of the second metal posts 320 can be greater than the height t' of the first metal posts 310, and the width d (such as diameter) of the end surfaces 310a of the first metal posts 310 can be greater than the width r (such as diameter) of the end surfaces 320a of the second metal posts 320. In the present embodiment, only one second electronic element 25a such as an active component is disposed on the second substrate 22.

Referring to FIG. 3', in another embodiment, the width d' of the end surfaces 310b of the first metal posts 310' can be equal to the width r' of the end surfaces 320b of the second metal posts 320'. Alternatively, referring to FIG. 3", the width d" of the end surfaces 310c of the first metal posts 310" can be less than the width r" of the end surfaces 320c of the second metal posts 320".

Figure 4:
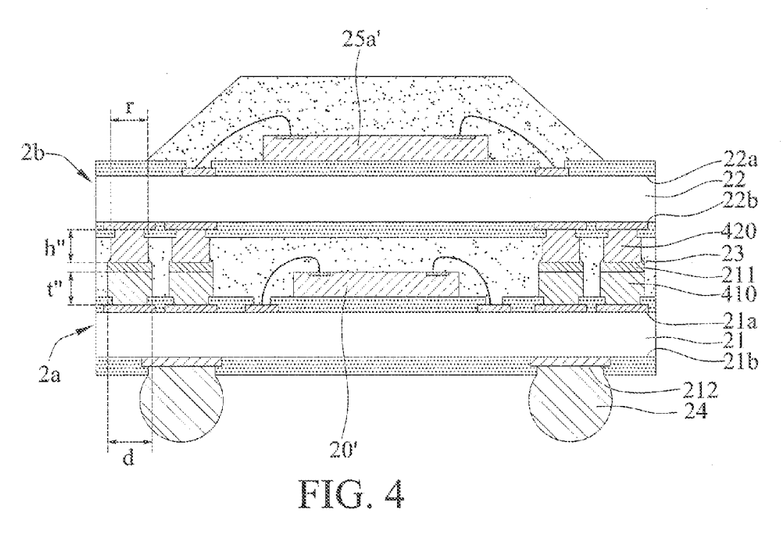

Referring to FIG. 4, in another embodiment, the height h" of the second metal posts 420 can be equal to the height t" of the first metal posts 410, and the first and second electronic elements 20', 25a' are electrically connected to the first and second substrates 21, 22, respectively, through wire bonding.

The present invention forms the first and second metal posts 210,220 through electroplating so as to stack and electrically connect the first and second package structures 2a, 2b. Compared with the conventional reflow process, the metal material of the first and second metal posts 210, 220 will not contaminate the surfaces of the first and second package structures 2a, 2b.

Further, referring to FIGS. 2G, 3 and 4, any variation in the heights of the first and second metal posts 210, 310, 410 will not change the predetermined diameters of the first and second metal posts 210, 310, 410, 220, 320, 420. Therefore, the area of the substrate surfaces (the first surface 21a and the fourth surface 22b) occupied by the first and second metal posts 210,310, 410, 220, 320, 420 will not increase, thereby avoiding reduction of spaces available for layout of the electronic elements and circuits. On the other hand, if the present invention requires the same number of circuits as in the prior art, the package stack device of the present invention will have a greatly reduced volume compared with the prior art.

Furthermore, since the first and second metal posts 210, 220 are formed by electroplating, the present invention avoids the risk of bridging when the heights of the first and second metal posts 210,220 are increased, thereby increasing the product yield.

Moreover, warpage of the first and second substrates 21, 22 is avoided since the second package structure 2b is supported on the first package structure 2a by the first and second metal posts 210, 220 and the gap between the first and second substrates 21, 22 is filled with the encapsulant 23 that is formed by such as molding.

The present invention further provides a package stack device, which has: a first package structure 2a, a second package structure 2b stacked on the first package structure 2a, and an encapsulant 23 disposed between the first and second package structures 2a, 2b.

The first package structure 2a has a first substrate 21 having a first surface 21a and a second surface 21b opposite to the first surface 21a, and a first electronic element 20, 20' disposed on the first surface 21a and electrically connected to the first substrate 21. The first surface 21a of the first substrate 21 has a plurality of first metal posts 210, 310, 310', 310", 410, and the second surface 21b of the first substrate 21 has a plurality of ball pads 212 for mounting solder balls 24. The first metal posts 210, 310, 310', 310", 410 are copper posts and formed by electroplating. The first electronic element 20, 20' is electrically connected to the first substrate 21 through wire bonding or in a flip-chip manner.

The second package structure 2b has a second substrate 22 having a third surface 22a and a fourth surface 22b opposite to the third surface 22a, and at least a second electronic element 25a, 25b, 25' disposed on the third surface 22a and electrically connected to the second substrate 22. The fourth surface 22b of the second substrate 22 has a plurality of second metal posts 220, 320, 320', 320", 420 which are connected to the first metal posts 210, 310, 310', 310", 410, respectively, so as for the second package structure 2b to be stacked on the first package structure 2a. The second metal posts 220, 320, 320', 320", 420 are copper posts and formed by electroplating.

The height h, h', h" of the second metal posts 220, 320, 320', 320", 420 can be less than, greater than or equal to the height t, t', t" of the first metal posts 210, 310, 310', 310", 410.

The encapsulant 23 is disposed between the first surface 21a of the first substrate 21 and the fourth surface 22b of the second substrate 22 to encapsulate the first electronic element 20, 20'.

Further, a solder material 211 is disposed between each of the first metal posts 210, 310, 310', 310", 410 and the corresponding second metal posts 220, 320, 320', 320", 420.

Furthermore, the width d, d', d" of the end surfaces 210a, 210b, 210c, 310a, 310b, 310c of the first metal posts 210, 310, 310', 310" is greater than, equal to or less than the width r, r', r" of the end surfaces 220a, 220b, 220c, 320a, 320b, 320c of the second metal posts 220, 320, 320', 320".

Figure 5A:
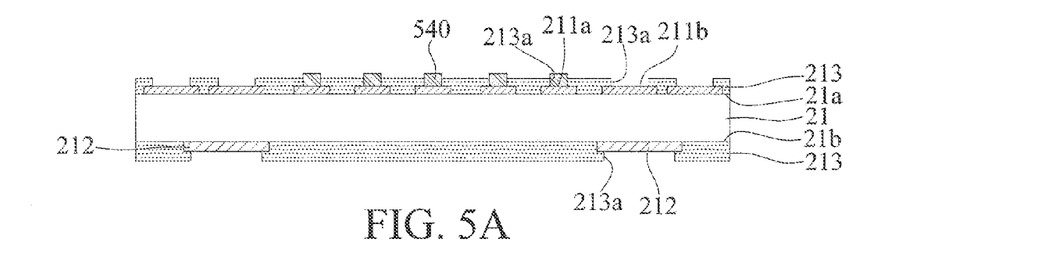
FIG. 5A to 5C are cross-sectional views showing a fabrication method of a package stack device according to a second embodiment of the present invention.
Figure 5B:
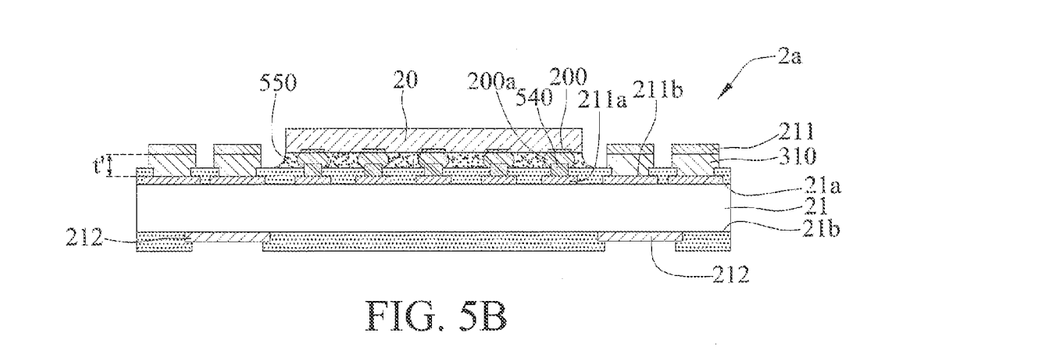
Figure 5C:
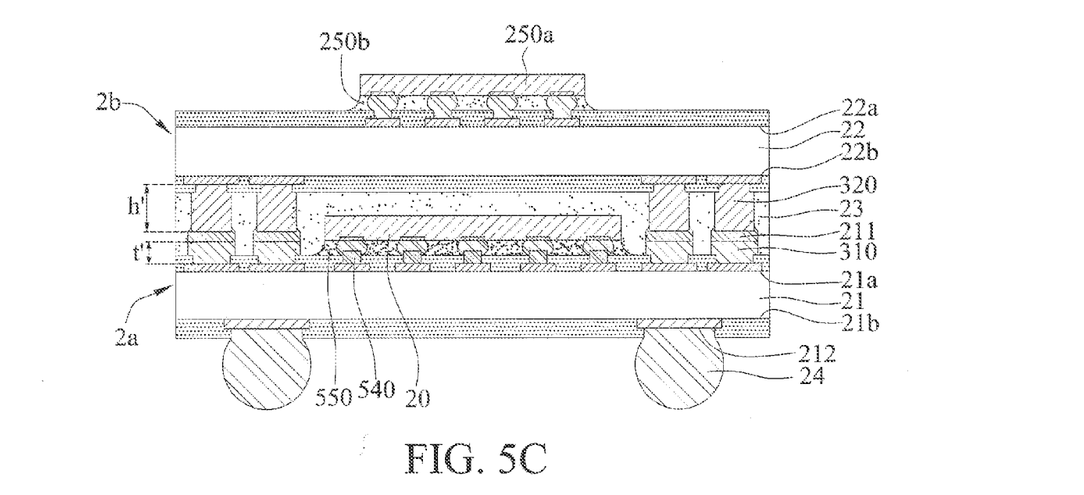

FIGS. 5A to 5C are cross-sectional views showing a fabrication method of a package stack device according to a second embodiment of the present invention. An only difference of the present embodiment from the first embodiment is the flip-chip manner of the first electronic element 20. Therefore, only the difference is detailed as follows, and description of the other processes that are the same as those of the first embodiment is omitted herein.

Referring to FIG. 5A, a plurality of metal bumps 540 are formed on the bonding pads 211a of the first substrate 21 of FIG. 2A.

Referring to FIG. 5B, a plurality of first metal posts 310 are formed on the exposed surfaces of the contact pads 211b by electroplating, and a plurality of solder bumps 200a are formed on the exposed surfaces of the metal bumps 540 so as for the first electronic element 20 to be disposed thereon. Further, an underfill 550 is disposed between the first electronic element 20 and the first surface 21a of the first substrate 21. In the present embodiment, the metal bumps 540 are copper bumps.

Referring to FIG. 5C, the stacking, molding and ball mounting processes as shown in FIGS. 2C to 2G are performed sequentially.

The present invention further provides a package stack device, which has: a first package structure 2a, a second package structure 2b stacked on the first package structure 2a, and an encapsulant 23 disposed between the first and second package structures 2a, 2b.

The first package structure 2a has: a first substrate 21 having a first surface 21a and a second surface 21b opposite to the first surface 21a, a first electronic element 20 disposed on the first surface 21a and electrically connected to the first substrate 21 in a flip-chip manner, and an underfill 550 disposed between the first electronic element 20 and the first surface 21a of the first substrate 21. The first surface 21a of the first substrate 21 has a plurality of first metal posts 310, and the second surface 21b of the first substrate 21 has a plurality of ball pads 212 for mounting solder balls 24. The first metal posts 310 are copper posts and formed by electroplating. The first electronic element 20 is an active component and/or a passive component.

The second package structure 2b has a second substrate 22 having a third surface 22a and a fourth surface 22b opposite to the third surface 22a, and a second electronic element 25a disposed on the third surface 22a and electrically connected to the second substrate 22. The fourth surface 22b of the second substrate 22 has a plurality of second metal posts 320 which are connected to the first metal posts 310, respectively, so as for the second package structure 2b to be stacked on the first package structure 2a. The second metal posts 320 are copper posts and formed by electroplating. Further, the height h' of the second metal posts 320 can be greater than, equal to or less than the height t' of the first metal posts 310.

The encapsulant 23 is disposed between the first surface 21a of the first substrate 21 and the fourth surface 22b of the second substrate 22 to encapsulate the first electronic element 20 and the underfill 550.

Further, a plurality of metal bumps 540 are disposed on the first surface 21a of the first substrate 21 for mounting the first electronic element 20. The metal bumps 540 can be copper bumps, and a solder material such as solder bumps 200a can be disposed on the metal bumps 540 and encapsulated by the underfill 550.

Furthermore, a solder material 211 is disposed between the first metal posts 310 and the second metal posts 320.

Therefore, the present invention aligns and connects the first and second metal posts so as to facilitate the stacking process for stacking the second package structure on the first package structure. Further, since the metal posts are formed by electroplating, the metal material of the metal posts will not contaminate the surfaces of the package structures. Furthermore, variation in the size of the metal posts is easy to control, thereby facilitating vertical stacking of the package structures so as to overcome the conventional drawback of joint deviation.

Moreover, any variation in the height of the metal posts will not increase the diameter of the metal posts and hence the surface area of the substrates that is occupied by the metal posts will not increase, thereby avoiding reduction of available spaces for layout of the electronic elements and circuits.

Also, since the metal posts are formed by electroplating, the present invention avoids the risk of bridging when the height of the metal posts is increased, thereby increasing the product yield.

In addition, the present invention avoids warpage of the substrates since the package structures are supported by the metal posts and the gap between the package structures is filled with the encapsulant.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package stack device, comprising:
a first package structure, comprising:
a first substrate having a first surface with a plurality of first metal posts formed thereon and a second surface opposite to the first surface, wherein the first metal posts are copper posts, and the second surface of the first substrate has a plurality of ball pads for mounting solder balls; and
a first electronic element disposed on the first surface of the first substrate and electrically connected to the first substrate, wherein the first electronic element is an active component and/or a passive component, and the first electronic element is electrically connected to the first substrate through wire bonding or in a flip-chip manner; a second package structure, comprising:
a second substrate having a third surface and a fourth surface opposite to the third surface, wherein the fourth surface has a plurality of second metal posts which are connected to the first metal posts, respectively, so as for the second package structure to be stacked on the first package structure, and wherein a width of end surfaces of the first metal posts is different from a width of end surfaces of the second metal posts, the second metal posts are copper posts, and a solder material is formed between each of the first metal posts and the corresponding second metal post; and a second electronic element disposed on the third surface of the second substrate and electrically connected to the second substrate; and an encapsulant formed between the first surface of the first substrate and the fourth surface of the second substrate to encapsulate the first electronic element, the first metal posts, and the second metal posts.

2. The device of claim 1, wherein the second metal posts are greater in height than the first metal post.

3. The device of claim 1, wherein the second metal posts are equal in height to the first metal posts.

4. The device of claim 1, wherein the second metal posts are less in height than the first metal posts.

5. A fabrication method of a package stack device, comprising the steps of:

providing a first substrate having a first surface with a plurality of first metal posts formed thereon and a second surface opposite to the first surface, disposing a first electronic element on the first surface of the first substrate and electrically connecting the first electronic element and the first substrate so as to form a first package structure, providing a second substrate having a third surface and a fourth surface opposite to the third surface, and disposing a second electronic element on the third surface of the second substrate and electrically connecting the second electronic element and the second substrate so as to form a second package structure, wherein the first metal posts are copper posts, the second surface of the first substrate has a plurality of ball pads for mounting solder balls, the first electronic element is an active component and/or a passive component, the first electronic element is electrically connected to the first substrate through wire bonding or in a flip-chip manner, the fourth surface of the second substrate has a plurality of second metal posts, and wherein a width of end surfaces of the first metal posts is different from a width of end surfaces of the second metal posts, the second metal posts are copper posts, and a solder material is formed between each of the first metal posts and the corresponding second metal post;

connecting the second metal posts to the first metal posts, respectively, so as to stack the second package structure on the first package structure; and forming an encapsulant between the first surface of the first substrate and the fourth surface of the second substrate for encapsulating the first electronic element, the first metal posts, and the second metal posts.

6. A package stack device, comprising:

a first package structure, comprising:

a first substrate having a first surface with a plurality of first metal posts formed thereon and a second surface opposite to the first surface, wherein the first metal posts are copper posts, and the second surface of the first substrate has a plurality of ball pads for mounting solder balls;

a first electronic element disposed on the first surface of the first substrate and electrically connected to the first substrate in a flip-chip manner, wherein the first electronic element is an active component and/or a passive component; and an underfill formed between the first electronic element and the first surface of the first substrate;

a second package structure, comprising:

a second substrate having a third surface and a fourth surface opposite to the third surface, wherein the fourth surface has a plurality of second metal posts which are connected to the first metal posts, respectively, so as for the second package structure to be stacked on the first package structure, and the height of the second metal posts is greater than, equal to or less than that of the first metal posts, and wherein a width of end surfaces of the first metal posts is different from a width of end surfaces of the second metal posts, the second metal posts are copper posts, and a solder material is formed between each of the first metal posts and the corresponding second metal post; and a second electronic element disposed on the third surface of the second substrate and electrically connected to the second substrate; and an encapsulant formed between the first surface of the first substrate and the fourth surface of the second substrate to encapsulate the first electronic element, the first metal posts, the second metal posts, and the underfill.

7. The device of claim 6, wherein the first substrate has a plurality of metal bumps disposed thereon for mounting the first electronic element.

8. The device of claim 7, wherein the metal bumps are copper bumps.

9. The device of claim 7, wherein a solder material is disposed on the metal bumps and encapsulated by the underfill.

* * * * *